United States Patent [19]

Harada

[11] Patent Number: 5,006,484

[45] Date of Patent: Apr. 9, 1991

[54] MAKING A SEMICONDUCTOR DEVICE WITH CONTACT HOLES HAVING DIFFERENT DEPTHS

[75] Inventor: Yusuke Harada, Tokyo, Japan

[73] Assignee: Oki Electric Industry Inc, Co., Japan

[21] Appl. No.: 472,765

[22] Filed: Jan. 31, 1990

[30] Foreign Application Priority Data

Feb. 1, 1989 [JP] Japan .................................. 1-20741

[51] Int. Cl.⁵ .......................................... H01L 21/441
[52] U.S. Cl. ..................................... 437/192; 437/195;
437/978; 437/982; 437/235; 148/DIG. 133
[58] Field of Search ............... 437/192, 978, 982, 195;
148/DIG. 133

[56] References Cited

U.S. PATENT DOCUMENTS 4,676,867 6/1986 Elkins et al. ........................... 437/40
4,933,297 6/1990 Lu ....................................... 437/192

FOREIGN PATENT DOCUMENTS 60-081842 10/1983 Japan .
62-235739 10/1987 Japan ................................... 437/240

Primary Examiner—Brian E. Hearn
Assistant Examiner—Laura M. Holtzman
Attorney, Agent, or Firm—Edward D. Manzo

[57] ABSTRACT

In a process of fabrication of a semiconductor device having a relatively deep contact hole and a relatively shallow contact hole; a lower interlayer insulating layer is formed on a semiconductor substrate, and then subjected to heat treatment to flow; an upper interlayer insulating film is then formed on the lower interlayer insulating film, and is then subjected to heat treatment to flow; a non-flowing film which does not flow is then formed in the area where the shallow contact hole will be formed; and the deep and the shallow holes are then formed through the upper interlayer insulating film and the non-flowing film and heat treatment is conducted to cause flow of the upper interlayer insulating film whereby the flow of the upper interlayer insulating layer occurs except at the area covered by the non-flowing film. The deep and the shallow contact holes are then filled with metal by selective CVD; and an interconnection is then formed to have contact with the metal filling the contact holes.

13 Claims, 2 Drawing Sheets

(a)

(b)

(c)

MAKING A SEMICONDUCTOR DEVICE WITH CONTACT HOLES HAVING DIFFERENT DEPTHS

BACKGROUND OF THE INVENTION

The present invention relates to a process of fabricating a semiconductor device having contact holes with different depths.

A prior-art process of semiconductor device fabrication is shown in FIG. 2. First, an insulating film 2 (such as $SiO_2$) for device isolation and a diffusion layer 3 are formed on a semiconductor substrate 1. Then, an insulating film 4 consisting of BPSG (boro-phosphosilicate glass) for example, is formed by CVD (chemical vapor deposition), and heat-treatment is then conducted to cause the insulating film 4 to flow thereby planarizing the surface. An opening 5 which will become a contact hole is then formed, and ion implantation is proformed through the opening 5. Another heat treatment is then conducted so that the slope of the wall of the contact hole will become gentle. An Al-Si alloy layer 6 which will become an interconnection (wiring conductor) is formed by sputtering, and interconnection pattern is then formed. This completes the fabrication of the semiconductor device.

A problem associated with the above process of fabrication is that as the degree of integration of the semiconductor device is increased, with the diameter of the opening 5 being reduced, and the aspect ratio (ratio depth/diameter of the contact hole) being increased, the step coverage of the Al-Si alloy layer 6 becomes poor, and the interconnection may be broken.

To eliminate this problem, techniques of filling the contact holes with metal have been developed. One of such techniques uses selective tungsten (W) CVD, and a semiconductor device obtained with this method is shown in FIG. 3. In this method, a device isolation insulating film 12 and a diffusion layer 3 are formed on a semiconductor substrate 11, in the same way as the method described with reference to FIG. 2, and then an insulating film 14 is formed and an opening 15 which will become a contact hole is formed. A tungsten film 16 is then formed by CVD such that there will be no step between the region of the contact hole 15 and the neighboring insulating film 14. An Al-Si alloy film 17 is then formed by sputtering, and then patterned by photolithography. In this method, the contact hole is filled with metal, so that interconnection breakage due to a poor step coverage can be avoided, and an interconnection with a high reliability can be obtained.

However, the contact holes may have different depths. For example, a contact hole for contact with a diffusion layer in the substrate is relatively deep, while a contact hole for contact with a gate electrode interconnection is relatively shallow. If the selective CVD is performed such thet there will be no step at the deep contact hole, the metal will flow over at the shallow hole. If, on the other hand, the selective CVD is conducted such that the there will be no step at the shallow contact hole, the thickness of the metal in the deep contact hole will be insufficient, and, when sputtering is performed on the resultant device, interconnection breakage may occur because of the poor step coverage.

The ion implantation into the contact is necessary to increase the impurity concentration at the surface of the contact Si in order to obtain a good ohmic contact. Moreover, to alleviate the sharpness of the steps, the interlayer insulating layer must have a good flowing property (tendency to flow easily when subjected to heat treatment), and is for example formed of BPSG. When heat treatment is conducted after the contact ion implantation, the walls surrounding the contact hole may also flow, and the opening is widened. When selective CVD is performed over the opening that has been widened, the resultant top surface will become convex. The flatness of the interconnection is degraded, and the degree of integration will be limited.

SUMMARY OF THE INVENTION

An object of the invention is to prevent breakage of the interconnection due to insufficient metal in a deep contact hole, and prevent the opening from being widened when an interlayer insulating layer which can flow is used, and thereby to increase the degree of integration.

A process of fabrication of a semiconductor device according to the invention comprises the steps of:
(a) forming a lower interlayer insulating film having a flowing property on a seminconductor substrate;
(b) conducting heat treatment to cause the lower interlayer insulating film to flow;
(c) forming an upper interlayer insulating film having a flowing property on the lower interlayer insulating film;
(d) conducting heat treatment to cause the upper interlayer insulating film to flow;
(e) forming a non-flowing film which does not have a flowing property in the area where the shallow contact hole will be formed;
(f) forming the deep contact hole through the upper interlayer insulating film and the lower interlayer insulating film and the shallow contact hole through the upper interlayer insulating film and the non-flowing film;
(g) conducting heat treatment to cause flow of the upper interlayer insulating film, whereby the flow of the upper interlayer insulating layer occurs except at the area covered by the non-flowing film;
(h) filling the deep contact hole and the shallow contact hole with metal by selective CVD; and
(i) forming an interconnection having contact with the metal filling the contact holes.

As a non-flowing film (film which does not have the flowing property) is formed around the area where a shallow contact will be formed, even if heat treatment is conducted after forming the contact hole, the upper interlayer insulating layer that is positioned around a shallow contact hole and is covered by the non-flowing film will not flow, and only the upper interlayer insulating film around the deep contact hole flows. As a result, in the subsequent selective CVD in which the contact holes are filled with metal, the resultant top surface over the shallow contact hole will be flat, while the upper interlayer insulating layer around the deep contact hole flows so that the although the deep contact hole is insufficiently filled with the metal, the mouth of the opening is gently sloped and there will be no sharp step, so that a good coverage will be obtained during the subsequent interconnection formation.

DETAILED DESCRIPTION OF THE PREFERRED EMBODIMENTS

Figure 1:
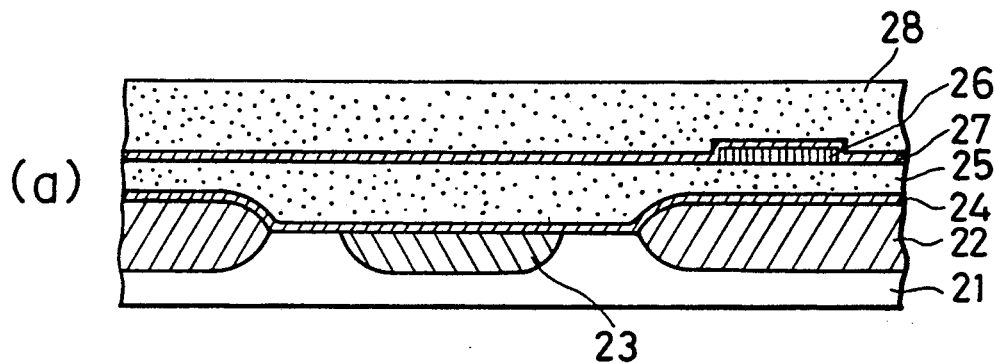
FIGS. 1(a)–1(c) steps of the of semiconductor device fabrication process according to the invention.
Figure 1:
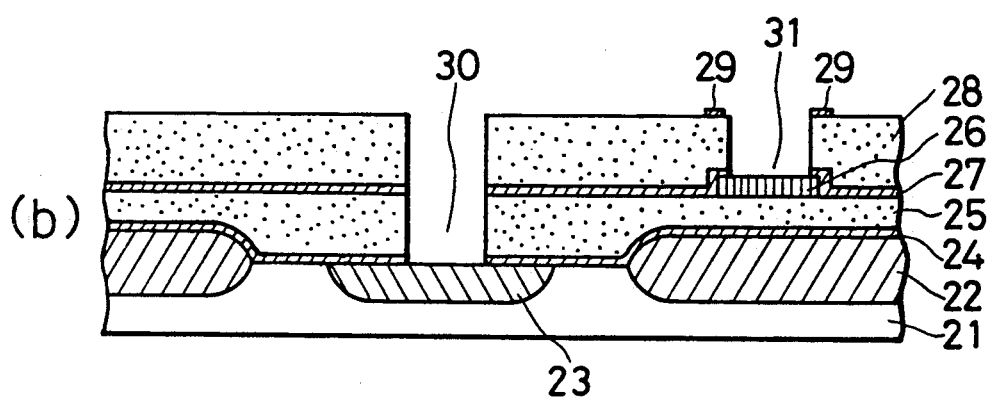
Figure 1:
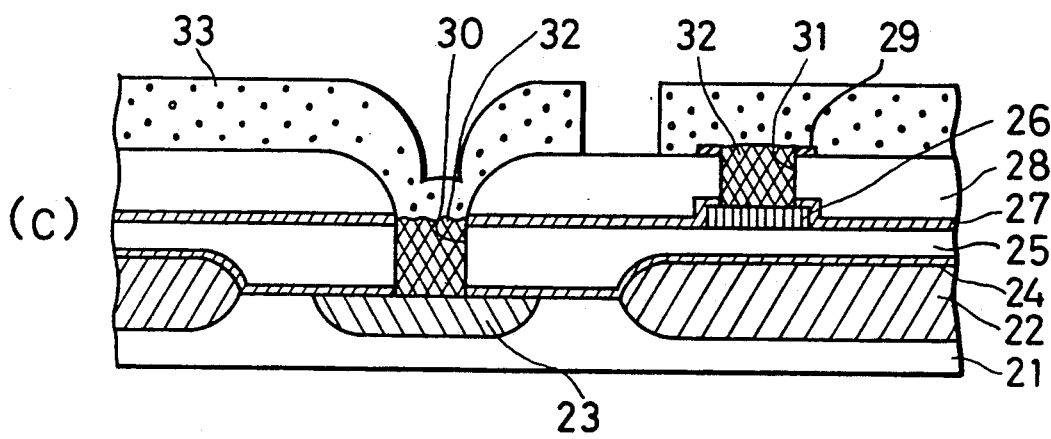
Figure 2:
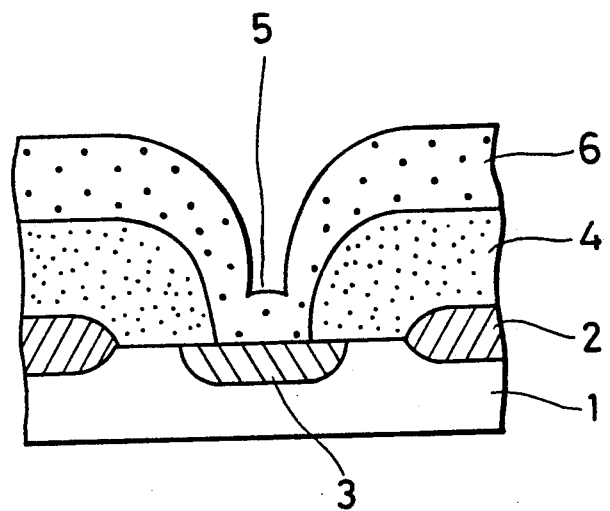
FIG. 2 and FIG. 3 are cross sectional views of semiconductor devices obtained by conventional fabrication processes.
Figure 3:
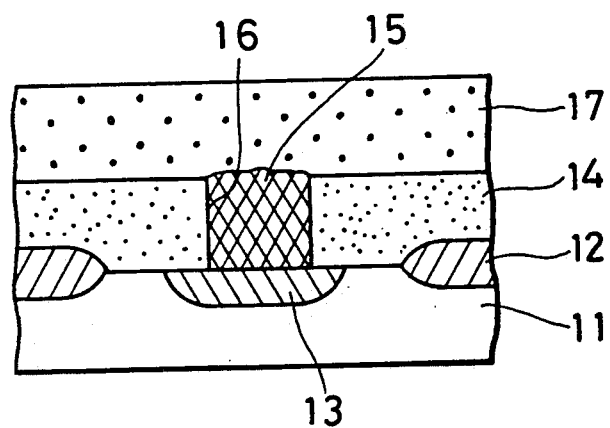

First, as shown at (a) in FIG. 1, a silicon semiconductor substrate 21 is prepared, and an insulating layer 22, for example of $SiO_2$, for device isolation, and a diffusion layer 23 are formed on the substrate 21. An insulating film 24, for example of $SiO_2$, for preventing diffusion of impurities from a lower interlayer insulating layer 25, to be formed later, is formed by CVD to a thickness of 1000 angstroms. Then, the lower interlayer insulating layer 25, which has a flowing property is formed by CVD to a thickness of 4000 angstroms. This lower insulating layer 25 may for example be formed of BPSG. Then, heat treatment is conducted to cause the lower interlayer insulating film 25 to flow. This heat treatment may for example be conducted in an $N_2$ atmosphere at 950° C. for 15 minutes. As a result of this heat treatment, the top surface will be substantially flat. After this, a silicide layer 26, for example WSi layer, serving as an interconnection (wiring conductor) for the gate electrode for example is formed on the lower interlayer insulating film 25, to a thickness of 2000 angstroms, and patterned. An intermediate interlayer insulating film 27, for example of $SiO_2$, is formed by CVD to a thickness of 1000 angstroms. The intermediate interlayer insulating film 27 does not have the flowing property and will restrain the flow of the lower interlayer insulating film 25 under the silicide layer 26 during the subsequent heat treatment, and thereby to prevent deformation during the heat treatment. An upper interlayer insulating film 28, for example of BPSG having a flowing-property is then formed by CVD to a thickness of 5000 angstroms. After this, heat treatment is conducted in an $N_2$ atmosphere at 900° C. for 15 minutes. As a result of this heat treatment, the top surface of the upper interlayer insulating layer will be planarized.

Then, as shown at (b) in FIG. 1, a non-flowing insulating film 29 is then formed on the planarized upper interlayer insulating film 28 by CVD to a thickness of 1000 angstroms. Example of the material of the non-flowing insulating film 29 are $SiO_2$ and PSG (phosphosilicate glass) containing 6 wt% of $P_2O_5$. Then, photolithography is conducted to remove the insulating film 29 except at the area where shallow contact holes will be formed on the silicide film 26. In this process, mask alignment is not critical because it is sufficient if the area where the insulating film 29 fully covers the area where a shallow contact hole 31 (over the gate electrode interconnection 26) will be formed. The non-flowing insulating film should not be formed in the area where a deep contact hole 30 (over the diffusion layer 23) will be formed. The non-flowing insulating film 29 may also be formed on the areas where other shallow contact holes will be formed. Then, the contact holes 30 and 31 are formed by photolithography. The contact hole 30 over the diffusion layer 23 will be deep while the contact hole over the gate electrode interconnection 26 will be shallow.

Then, ion implantation is conducted for the purpose of increasing the surface impurity concentration thereby to obtain a good ohmic contact, and for the purpose of restraining the leak current due to mask misalignment. The conditions of the ion implantation may for example as follows.

For producing a P+ diffusion layer:
  the ion source is $BF_2$,
  the acceleration energy is 30 KeV, and
  the dose is $5 \times 10^{15}$ ions/cm$^2$.
For producing a N+ diffusion layer:
  the ion source is $^{31}P+$,
  the acceleration energy is 40 KeV, and
  the dose is $5 \times 10^{15}$ ions/cm$^2$.

Then, heat treatment for activation is conducted in $N_2$ atmosphere at 850° C. for 20 minutes. As a result of this heat treatment, the upper interlayer insulating layer 28 formed of BPSG around the deep contact hole 30 flows, as shows at (c) in FIG. 1 The upper interlayer insulating layer 28 around the shallow contact hole 31 is not affected because it is covered and supported by the non-flowing insulating film 29 which doe not flow. Then, a tungsten film 32 is formed by selective CVD to such a thickness that there will be no steps between the shallow contact hole 30 and the insulating film 29. As a result of this selective CVD, the deep contact hole 30 is filled with the tungsten metal 32 to the same thickness as in the shallow contact hole 31. Then, Al-Si alloy film 33 which will become an interconnection is formed by sputtering to a thickness of 7000 angstroms, and then patterned by photolithography. As a result, a semiconductor device shown at (c) in FIG. 1 is obtained. Because no steps are created at the shallow contact hole, and the slope at the deep contact hole is gentle, the step coverage of the interconnection 33 will be good.

In the above embodiment, the contact holes 30 and 31 are filled with tungsten, but other metals, such as molybdenum (Mo) or aluminum (Al), can also be used.

In the embodiment described, the shallow contact hole is for connection with an interconnection for gate electrodes, but the invention is also applicable where the shallow contact hole is for connection with an interconnection for source/drain electrodes, i.e., bit lines.

As has been described, according to the invention, after the lower interlayer insulating film is caused to flow for planarization, a non-flowing insulating film which does not have a flowing property is formed to cover the area where a shallow contact will be formed, even if heat treatment is conducted after forming a contact hole, the upper interlayer insulator layer will not flow, and only the upper interlayer insulating layer around the deep contact hole flows. As a result, in the subsequent selective CVD in which the contact holes are filled with metal, the resultant top surface over the shallow contact hole will be flat, while the upper interlayer insulating layer around the deep contact hole flows so that although the deep contact hole is insufficiently filled with metal, the mouth of the opening is gently sloped and there will be no sharp steps, so that a good coverage will be obtained when the interconnection is subsequently formed.

What is claimed is:
1. A process for fabrication a semiconductor device having a relatively deep contact hole and a relatively shallow contact hole, comprising the steps of:
  (a) forming a lower interlayer insulating film having a flowing property on a semiconductor substrate:
  (b) performing a heat treatment to cause said lower interlayer insulating film to flow:
  (c) forming an upper interlayer insulating film having a flowing property on said lower interlayer insulating film;
  (d) performing a heat treatment to cause said upper interlayer insulating film to flow; (e) forming a non-flowing film which does not have a flowing property in the area within which said shallow contact hole will be formed;

(f) forming said deep contact hole through said upper interlayer insulating film and said lower interlayer insulating film and forming said shallow contact hole through said upper interlayer insulating film and said non-flowing film;

(g) performing a heat treatment to cause said upper interlayer insulating film to flow, whereby said upper interlayer insulating layer flows except at the area covered by said non-flowing film;

(h) filling said deep contact hole and said shallow contact hole with metal by selective CVD; and (i) forming an interconnect in contact with said metal filling said contact holes.

2. The process of claim 1, further comprising the step of:

(j) forming an additional interconnection on said lower interlayer insulating layer; before said step of forming an upper interlayer insulating layer.

3. The process of claim 1, further comprising the step of:

(k) forming an intermediate insulating film over said additional interconnection, before said step of forming an upper interlayer insulating layer.

4. The process of claim 2, wherein said additional interconnection is an interconnection for a gate electrode.

5. The process of claim 3, wherein said intermediate interlayer insulating layer does not have a flowing property.

6. The process of claim 5, wherein said intermediate insulating film is formed of $SiO_2$.

7. The process of claim 1, wherein said lower interlayer insulating layer is formed of BPSG.

8. The process of claim 1, wherein said upper interlayer insulating layer is formed of BPSG.

9. The process of claim 1, wherein said non-flowing film is an insulating film.

10. The process of claim 1, wherein said non-flowing film is formed of $SiO_2$.

11. The process of claim 1, wherein said non-flowing film is not formed in the area where the deep contact hole will be formed.

12. The process of claim 4, wherein said shallow contact hole is formed for contact with said additional interconnection.

13. A process of forming an integrated circuit structure having first and second contact holes, said first hole being shallower than said second hole, comprising the steps of:

forming a multi-layar structure above a substrate, the multilayer structure comprising a lower insulating layer having a substantially flat upper surface, and a flowable upper insulating layer above said flat upper surface;

establishing a non-flowing film upon said upper insulating layer where the first contact hole is to be formed while leaving the region where the second contact hole is to be formed not covered by said non-flowing film; then forming said first contact hole through said non-flowing film and forming said second contact hole, said first hole being formed shallower than said second hole; then flowing said upper insulating film while protecting the region surrounding said first contact hole by said non-flowing film; then filling said first and second contact holes at least partially with a conductive material; and then forming interconnections to said first and second contact holes.

* * * * *